United States Patent [19]
Jang et al.

[11] Patent Number: 5,765,013
[45] Date of Patent: Jun. 9, 1998

[54] DIGITAL SIGNAL PROCESSOR

[75] Inventors: Ho-rang Jang, Incheon; Young-hoon Chang; Seoung-hwan Cho, both of Suwon, all of Rep. of Korea

[73] Assignee: Samsung Electronics Co., Ltd., Suwon, Rep. of Korea

[21] Appl. No.: 675,036

[22] Filed: Jul. 3, 1996

[51] Int. Cl.⁶ .......................... H04B 12/04; G06F 13/00; G06F 7/50; G06F 7/52
[52] U.S. Cl. ............... 395/800.17; 395/555; 364/716.07
[58] Field of Search ...................... 395/555, 200.33, 395/200.77, 200.75, 586, 446, 800.17, 588, 736.01; 84/622, 645; 364/DIG. 1, DIG. 2, 748.16, 715.2; 382/152; 348/14; 379/88, 93.17

[56] References Cited

U.S. PATENT DOCUMENTS

| | | | |
|---|---|---|---|
| 5,210,836 | 5/1993 | Childers et al. | 395/588 |
| 5,376,752 | 12/1994 | Limberis | 84/622 |

FOREIGN PATENT DOCUMENTS

| | | |
|---|---|---|
| 1 539 876 | 1/1979 | United Kingdom . |
| 2 208 187 | 3/1989 | United Kingdom . |

OTHER PUBLICATIONS

Dialog record 01864275 of *Electronic Engineering Times*, n871, 23 Oct. 1995, p.53(2), R. Shenhav, "Telecore allows for right connections."

*Primary Examiner*—Daniel H. Pan
*Attorney, Agent, or Firm*—Burns, Doane, Swecker & Mathis, L.L.P.

[57] ABSTRACT

A digital signal processor includes an execution unit separated into an arithmetic unit, a multiplier unit, a logic unit, a shift unit and a log unit, to implement CCITT G721 ADPCM algorithm with a relatively small size, which reduces the system cost. Also, since the digital signal processor primarily takes into consideration of low power consumption, it is applicable to a mobile communication system. Also, the digital signal processor is capable of implementing easily other ADPCM rates and algorithms as well as the ADPCM algorithm by modifying only the program of an instruction ROM.

9 Claims, 9 Drawing Sheets

FIG. 7E $T_1 \gg T_2 \quad \therefore \quad P_{ii} \gg P_{ij}$

DIGITAL SIGNAL PROCESSOR

BACKGROUND OF THE INVENTION

The present invention relates to a digital signal processor, and more particularly, to a digital signal processor for implementing an adaptive differential pulse coded modulation (ADPCM) algorithm widely used in a digital communication field by a specific microprocessor for the ADPCM.

Currently, digital communication methods are widely used in order to overcome drawbacks of analog methods. In an voice band data communication, a pulse coded modulation (PCM) method for encoding data in binary signals is widely used. In an international PCM communication (G.711 recommended by the Comit'e Consultatif International T'el'egraphique et T'el'ephonique (CCITT)), a voice signal sampled at 8 KHz is encoded into an 8-bit pulse code modulated (PCM) data, and then is transmitted at 64 K bits per second (Kbps). A reduction of the transmission rate of the PCM data increases the channel capacity. Therefore, the CCITT has adopted a recommendation G.721 ADPCM in which the data transmission rate is 32 Kbps. 32 Kbps ADPCM transmits the nearly same quality data but has double the channel capacity, compared with 64 Kbps PCM.

Such an ADPCM algorithm is adopted in various communication system. Also, the ADPCM is adopted for a digital cordless telephone which is growing rapidly in a mobile communication field. Nowadays, the ADPCM algorithm is an essential part of the mobile communication field.

Existing systems use the ACPCM algorithm implemented by a general purpose digital signal processing (DSP) microprocessor. However, the general DSP microprocessor is not suitable to adopt a specific algorithm in many aspects. In other words, first, the size of data processed by the execution unit is exceedingly larger than is necessary. Therefore, many logic elements for the execution are driven making the system large, which in turn requires a relatively greater power consumption. Second, the operating frequency is relatively high. Third, various instructions and circuits not necessary for a specific algorithm exist. Fourth, various instructions should be combined for implementing simple operations often used for the specific algorithm by the general purpose DSP processor.

The above-mentioned problems are impediments to the mobile communication system such as the digital cordless telephone, in which a low power consumption is essentially necessary. Also, these problems increase the cost of the system.

Figure 1:
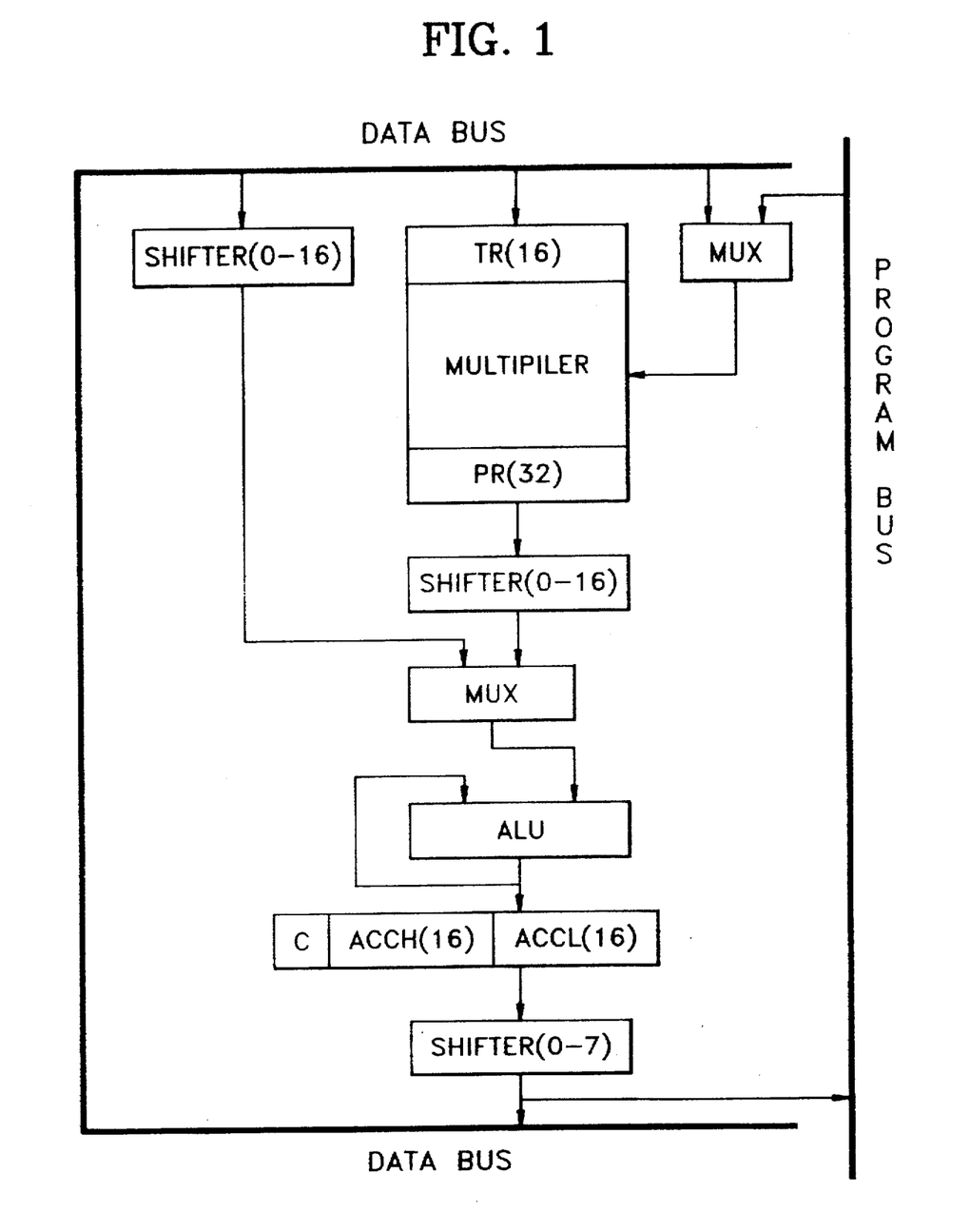
FIG. 1 is a schematic diagram of the execution units for a conventional DSP.

FIG. 1 is a schematic diagram of an execution unit of a conventional DSP, in which a logic function and an arithmetic function are performed by a single arithmetic logic unit (ALU), and a multiplier and a shifter are arranged vertically. In the conventional DSP, when mutually independent logic function and arithmetic function are processed by a single ALU, the number of operating gates is unnecessarily increased during execution of an operation to a greater extent than the case of being separately processed. The increased number of operating gates results in increased power consumption.

Also, since one execution unit operative to change the output value is connected to another execution unit in the vertical arrangement of the respective execution units the number of is unnecessarily increased operating gates. For example, if a multiplier is operated in order to execute a multiplication, a shifter and an ALU connected thereto also operate unnecessarily.

In addition, in the conventional DSP, after completely processing the current data, instructions such as "no operation" or "jump operation" are continuously executed until the next data to be processed is input, which causes unnecessary power consumption.

SUMMARY OF THE INVENTION

To solve the above problems, it is an object of the present invention to provide a digital signal processor of low power consumption in which an ADPCM algorithm is implemented by its specific microprocessor.

To accomplish the above object of the present invention, there is provided a digital signal processor comprising: three data buses; clock generating means for generating a plurality of clocks necessary for a microprocessor; input/output means for supplying parallel input/output and serial input/output for interface with the outside; controlling means for controlling the entire functioning of the microprocessor to transmit a control signal and a data signal to a desired position via the data buses; execution means having an arithmetic unit, a multiplier unit, a logic unit, a shift unit and a log unit, for performing arithmetic and logic operations under the control of the controlling means; data storage means for storing instructions and data necessary for ADPCM algorithm and executions; and register means for temporarily storing instructions or data output from the data storage means.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

In the CCITT G.721, the executions are mostly composed of arithmetic functions such as shift, addition, subtraction or multiplication and logic functions such as OR, AND or EX-OR. The magnitudes of variables range from 1 bit to 19 bits. However, most variables are less than 16 bits. The maximum number of the variables of the respective memories of an encoder and a decoder is 32.

Since the basic specification of the digital signal processor (DSP) according to the present invention complies with the CCITT recommendation G.721, the basic material is set to 16 bit size and the basic clock frequency of the system is 16.2 MHz to be the same as the system clock to be adopted later. The basic requisite functions include addition, subtraction, multiplication, shift, LOG, XOR, AND, OR, NOT and two's complement. The input and output of material are compatible with those of the commercial PCM CODEC having a sampling frequency of 8 KHz. The PCM signals are concurrently input and output in serial. Also, the PCM input clock is internally generated or is externally selected. For the PCM signals, A-LAW and μ-LAW methods of international specification (CCITT G.711) and 14-bit linear PCM are utilized. Since various constants are used, a ROM storing the constants is disposed. Also, as the system flags, "LAW," "COMPAND" and one-bit data flags indicating sign, zero and the characteristics of PCM signals, are used.

Since the microinstruction in the DSP according to the present invention is composed of 31 instructions, and a stack 22 for calling a sub-program is constructed, only the instructions that are used often for ADPCM are selected among instructions for a general processor. Also, in order to support the ADPCM algorithm efficiently, special instructions such as ENJUMP, GPM or LOG are added.

Figure 2:
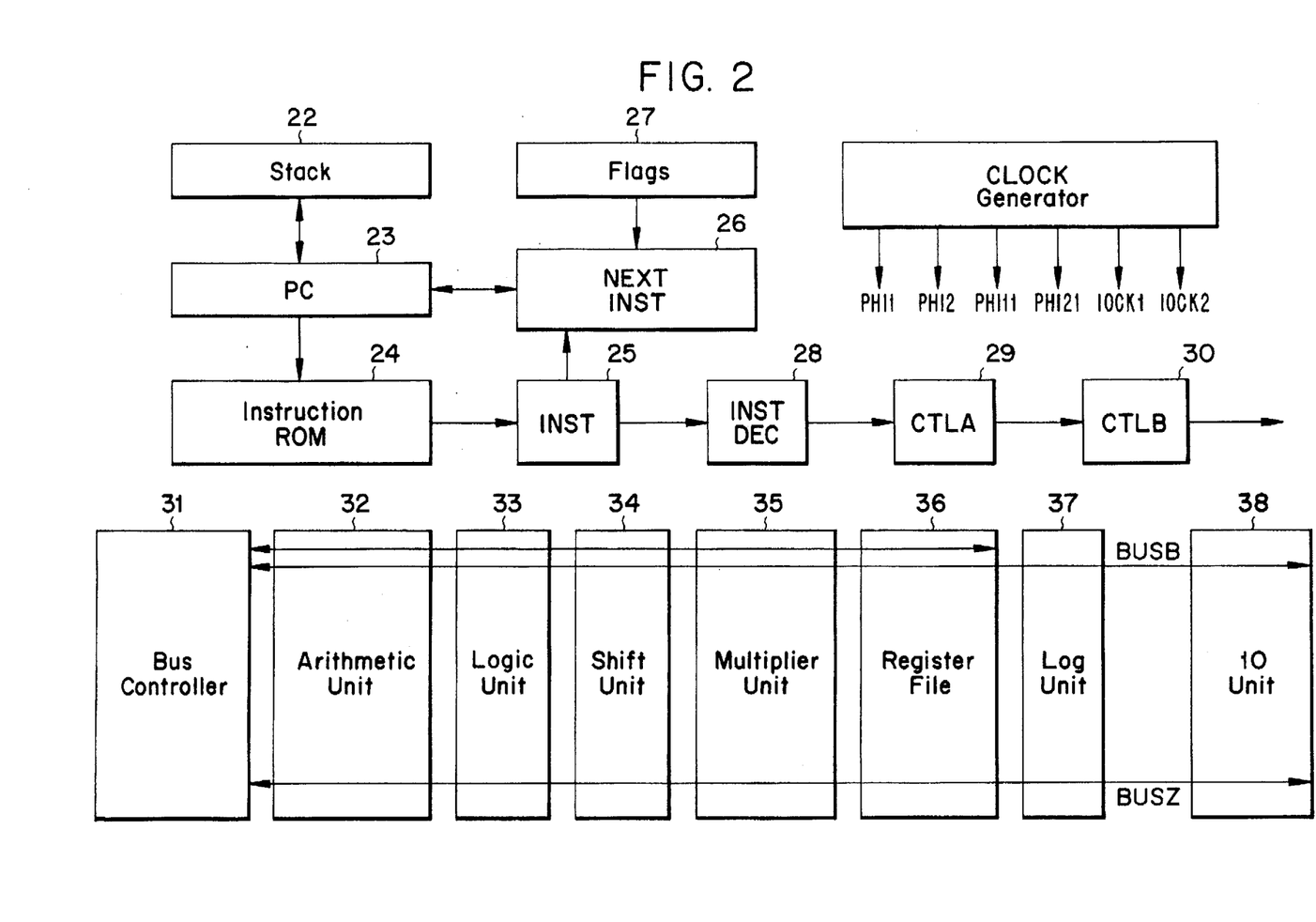
FIG. 2 is an overall block diagram of a microprocessor implemented by the DSP according to the present invention.

As shown in FIG. 2, the basic structure of the DSP according to the present invention is an RISC structure which combines a pipeline structure in which an instruction is processed during one clock cycle with a Harvard structure in which instructions and data are separated. The DSP utilizes three buses BUSA, BUSB and BUSZ for moving data, and includes a input/output (IO) unit 38, a bus controller 31, execution units 32 through 37, data storage units 22, 23, 24 and 27, registers 25, 26, 29 and 30, and a clock generator 21.

Figure 9:
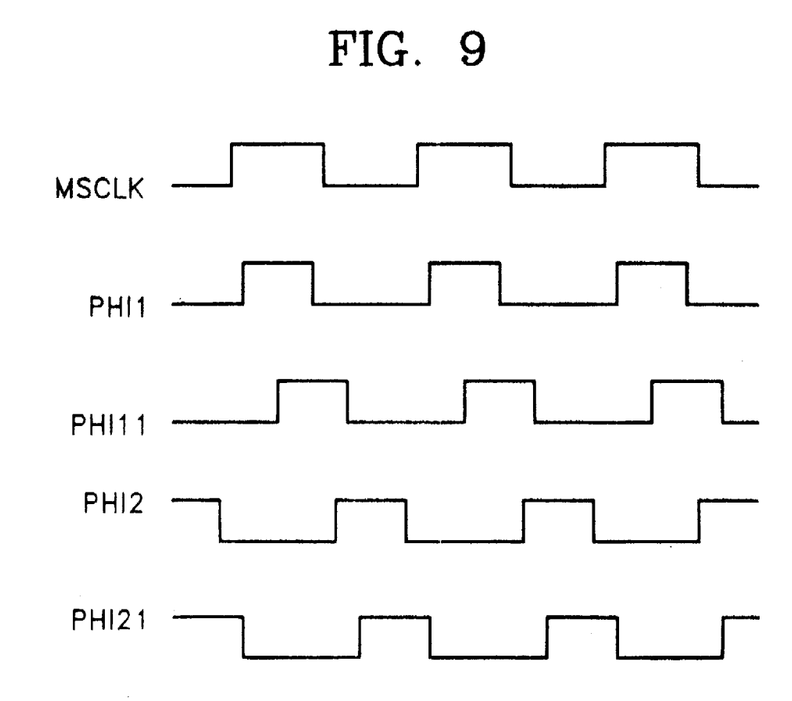
FIG. 9 illustrates clock signals of the microprocessor shown in FIG. 2.

Clock generator 21 supplies clocks necessary for the system, and generates the clocks depending on the state of the system, as shown in FIG. 9. The clocks are basically non-overlap two phase clocks. Execution units 32 through 37 use 4 phases.

Figure 3:
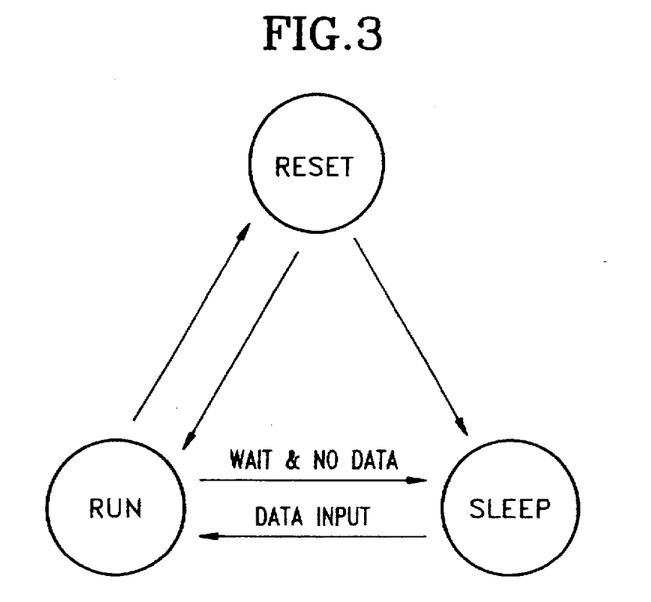
FIG. 3 illustrates the state of the microprocessor shown in FIG. 2.

Also, as shown in FIG. 3, for low power consumption, a SLEEP state which does not exist in the conventional DSP is adopted, in addition to a RESET state and a RUN state. In the SLEEP state, the system clock is not generated so that all circuits except input/output (IO) unit may not operate. In the SLEEP state, the encoding and decoding of input signals are completed and then the incoming of the next input signal is awaited, which minimizes the number of gates operating which leads to lower power consumption. Then, if the next input signal is received, the system immediately returns to the operative state (RUN) to execute the encoding and decoding functions.

Since the DSP according to the present invention includes a program in a chip, unlike the general purpose DSP, the instruction fetch cycle is short. In other words, typically, time exceeding one clock cycle or more is necessary in order to read data from an external memory. However, according to the present invention since the incorporated memory of the program chip supports high speed implementation, data can be read out within one clock cycle, which also lowers power consumption. The most noticeable characteristic of the DSP according to the present invention is in that all instructions are executed within one clock cycle.

Figure 4:
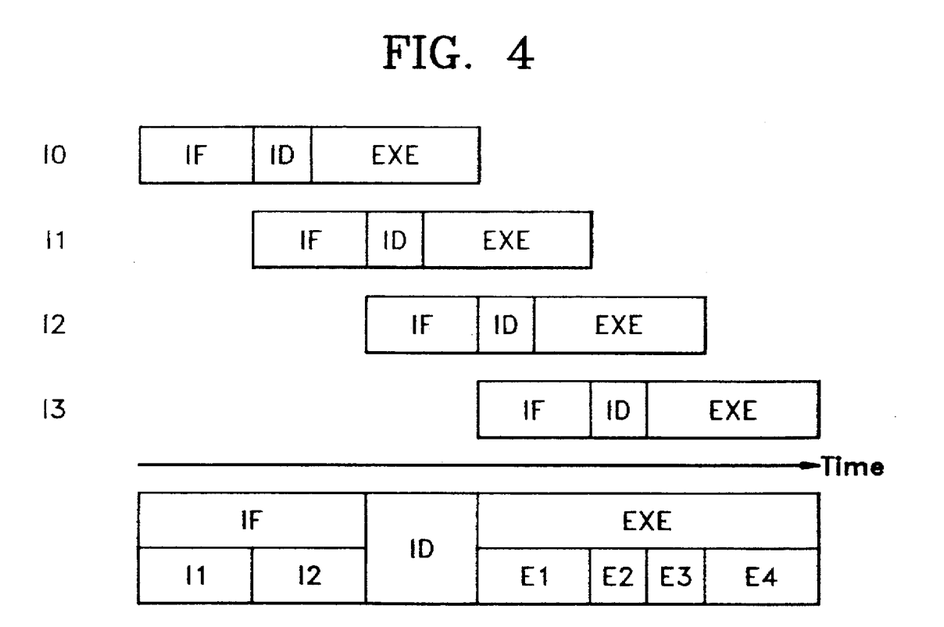
FIG. 4 illustrates the structure of pipe lines adopted to the microprocessor shown in FIG. 2.

The pipeline has a three-step structure and the function of each step is shown in FIG. 4.

Referring to FIG. 4, in the IF step, the instruction is read in and the address of the next instruction is calculated. This calculation is processed by an independent circuit without using any circuit of the execution units. The independent circuit checks the jump condition during execution of jump instruction, and adds a relative value to the current program counter. In this way, the position of the next instruction is not calculated in the execution unit but is processed by a specific circuit. By avoiding the instruction execution and resource conflict the pipeline is not broken. Also, the next instruction can be read in within one cycle thereby improving the performance of the processor.

Figure 5A:
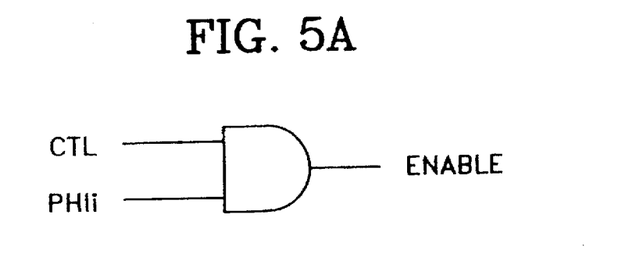
FIGS. 5A through 5C illustrate operating signals, control signals and clock signals having the same phases or different phases of the execution units, respectively.
Figure 5B:
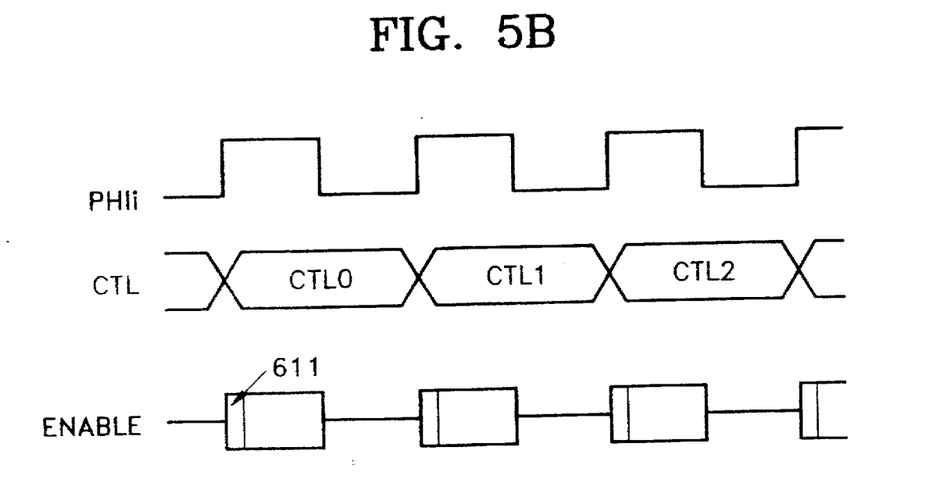
Figure 5C:
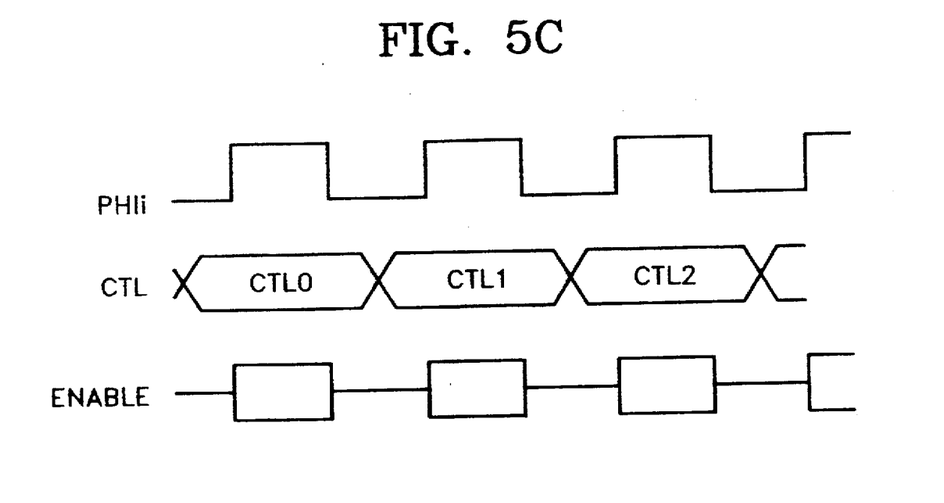

In the ID step for interpreting the function of the read instruction, all necessary control signals are generated. The generated control signals are two type signals synchronized with signals PHI11 and PHI21. These control signals are separately used for input control and output control in the execution unit. Also, if the control signal and clock signal have the same phase, the actual control signal which operates the execution unit may cause a malfunction of the execution unit. In order to avoid the malfunction, the control signal and clock signal use clocks having different phases. Most execution units operate from a signal obtained by performing an AND operation with respect to the control signal and clock signal, as shown in FIG. 5A. However, if the clock signal and control signal have the same phase, in a virtual circuit, the control signal is delayed by the length of a wire and another reasons. Thus, in such a portion 601 shown in FIG. 5B, glitch or malfunction may be generated. In order to prevent this occurrence, an AND operation is performed using signals having different phases from each other, as shown in FIG. 5C.

Referring back to the EX step in FIG. 5, operands are fetched and are operated, and the execution result is stored in the register. In the general processor, the operand is read in using an indirect address assignment method. However, since this method may break the pipeline, it is not adopted in the present invention. Also, in order to prevent the pipeline from being broken, the time for executing all instructions is set to one clock cycle.

In order to transfer operands and results independently, three buses of 16-bit size are used. During execution of the instructions, four phases are used for the clock. Four phases are used to prevent excessive consumption of power, which can be caused by the induction of the input values varying for a time as long as the inputs of the execution unit. Using two phases means that the input bus and the input of the execution unit are driven at the same time, which makes the driving time longer.

Figure 6:
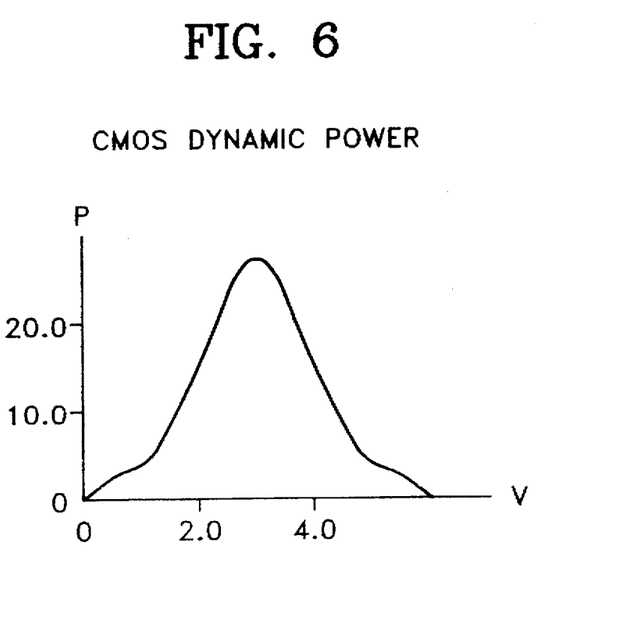
FIG. 6 is a graph showing the consumed power during operation of a CMOS circuit.

Most of the power consumption for a CMOS circuit occurs at the time of the change of signal values, as shown in FIG. 6. Thus, as the driving time becomes longer, the power consumption of the execution unit increases in proportion to the driving time, which is expressed in the following relationship:

$$P \propto N \cdot p \cdot \Delta t$$

where P represents the consumed power, N represents the number of operating gates, p represents the instantaneously consumed power, and Δt represents the time of instantaneous voltage change. As indicated in the above relationship, the consumed power is proportional to the number of operating gates and the time of instantaneous voltage change. Of course, the consumed power is proportional to the instantaneously consumed power. However, this factor cannot be considered in the actual design of a semiconductor. Therefore, the microprocessor according to the present invention is designed to reduce the number of operative gates and minimize the time of voltage change. In other words, in order to reduce power consumption, the time for driving buses and the time for driving execution units are separated. For this purpose, four-phase clocks are used in the EX step, which also reduces the instant maximum current value resulting in a stable system operation.

Figure 7A:
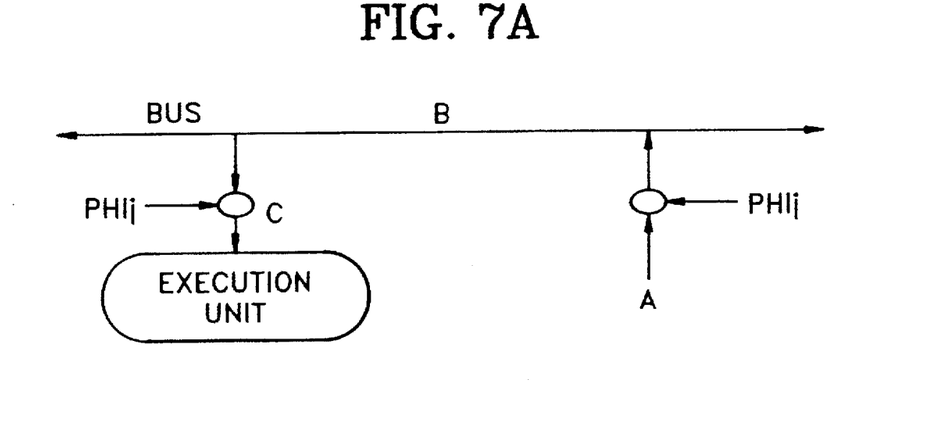
FIGS. 7A through 7E illustrate the comparison of consumed power depending on the control of input and output at the execution unit.
Figure 7B:
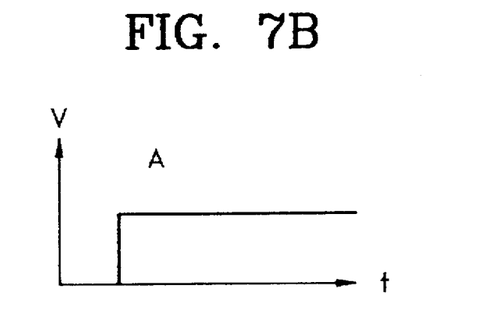
Figure 7C:
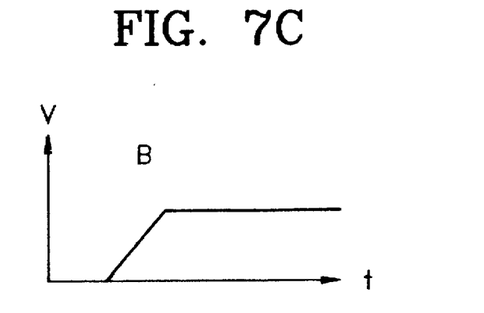
Figure 7D:
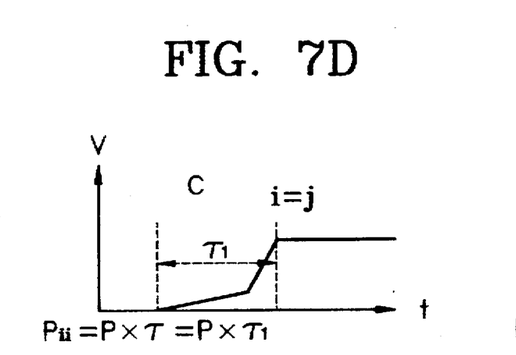
Figure 7E:
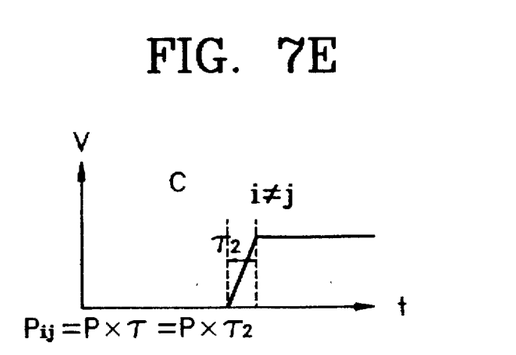

FIG. 7A illustrates the unit in which executions are performed by reading data from a register, in which A represents a register output part, and B represents an input bus of the execution unit. FIG. 7B shows the change of signal values at the A portion. The B portion is driven by a clock signal PHIi to obtain the change of signal values as shown in FIG. 7C. The change of signal values at this portion is related to the resistance and capacitance of a bus. FIG. 7D shows the change of signal values at the C portion when the clock signals PHIi and PHIj are the same. Here, the instant of the signal value change is the time taken for driving the bus and for driving the input part of the execution unit. FIG. 7E shows the change of signal values at the C portion when PHIj is opened after driving the input bus. At this time, the time represents the time taken for driving the input of the execution unit. To compare FIG. 7D with FIG. 7E, it is appreciated that the change of input values of the C portion corresponding to the execution unit where most power consumption occurs, is different from one another. As shown in FIG. 6, the longer the time of change, the more power is consumed. Thus, it is understood that the excution unit shown in FIG. 7E consumes less power than that shown in FIG. 7D.

The execution unit includes an arithmetic unit, a multiplier unit, a logic unit, a shift unit and a log unit, and is different from other general purpose processors in that it is designed to have several separate units that are located in parallel. This arrangement minimize the number of operative gates needed during execution of an instruction resulting in lower power consumption and reduced delay of the execution unit. Also, a multiplier for calculating 8-bit inputs is used instead of one for calculating 16-bit inputs. This is because there is hardly any case of multiplying of the inputs exceeding 16-bits in the ADPCM algorithm. Moreover, if a 16-bit multiplier is adopted, the execution result becomes 32-bit data, which cannot be stored in a register file within one clock cycle. In other words, a pipeline structure in which an instruction is executed within one clock cycle is broken.

Figure 10:
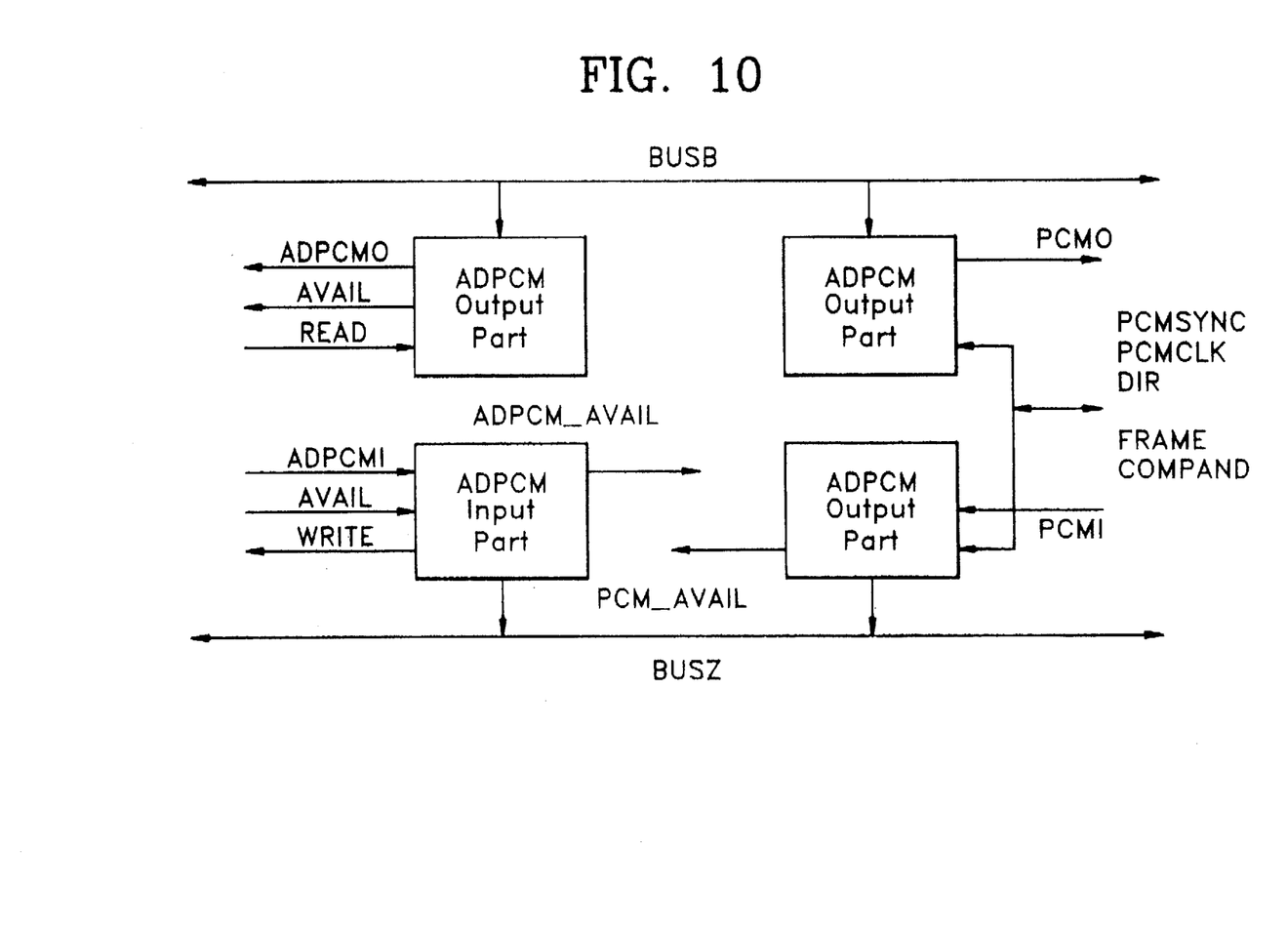
FIG. 10 is a detailed block diagram of the input/output means shown in FIG. 2.

As shown in FIG. 10, the input/output parts, which conduct the input and output to/from the outside, supply both the parallel input/output and the serial input/output. The serial input/output is made to be compatible with the input/output signals of a commercial PCM CODEC to read the input sampled at 8 KHz in serial. The design is such that the output is concurrently conducted with the input. Short and long synchronization signals are both supplied, and an internal or an external signal is selectively used as the input clock. While the serial input/output is used in inputting/outputting the PCM data corresponding to the voice signal, the ADPCM data are input/output in parallel. In the parallel input/output, a hand-shaking method is used, and there is provided a flag signal permitting input or output or a control signal actually conducting the input or output. In other words, if the input/output is allowed considering the flag signal, data is input/output by the control signal.

Since the microprocessor according to the present invention utilizes a automatic logic synthesis to obtain a design independent of the process, chips are not verified efficiently by a simple input signal value (test vector). This is because the virtual circuit may be variable depending on the synthesis condition and the device process technology. Since it is almost impossible to test chips with specific chips, a generalized testing method should be proposed. Also, since it is intended to attain a core library, using many pins for verification may cause a burden on the chip adopting the library. Also, a full scan method, which is widely used, is not adopted in the present invention as it requires many input vectors for chip verification.

Figure 8:
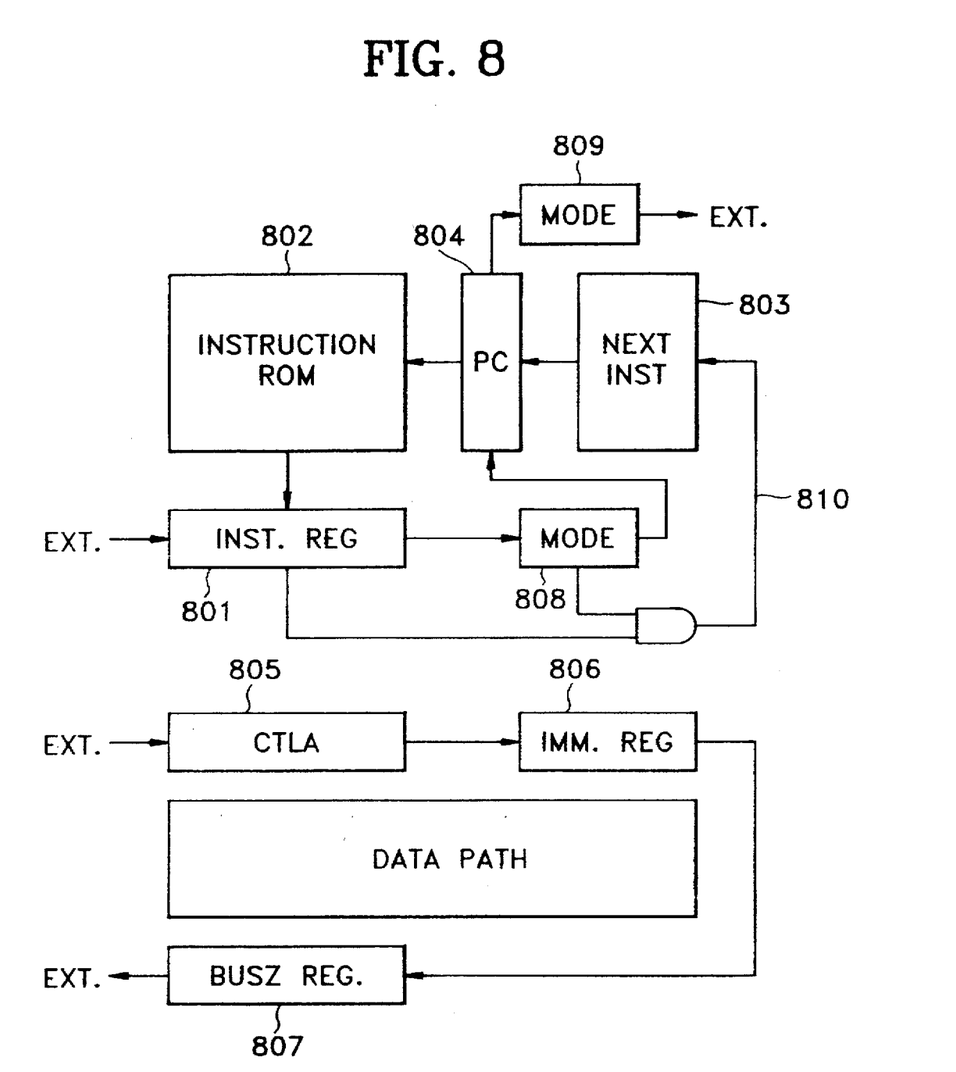
FIG. 8 is a block diagram of a circuit for chip verification.

The method proposed by the microprocessor according to the present invention is to test various blocks of the processor by operating the important register such as an instruction register (INST.REG) 801 in many ways, as shown in FIG. 8.

In order to test an instruction ROM 802 which is a major part of the system, the instruction register is operated in a data compression mode. At this time, "N_OP" which means no operation is input to a block (NEXT INST) 803 for calculating the next instruction to increase a program counter (PC) 804 sequentially. The contents of instruction ROM 802 are sequentially read out to be compressed and then the data are output externally in serial, thereby testing the instruction ROM 802.

In order to test the block (NEXT INST) 803 for calculating the next instruction address, instruction register 801 is set to a random number generation mode, and program counter (PC) 804 is operated in a data compression mode. The signal values and the generation sequence thereof are adjusted by an initial value of instruction register 801. Then, the contents of program counter 804 are output externally, thereby testing the circuit 803.

In order to test a stack and an execution unit, instruction register 801 is set with specific instructions and a mode in which only the operand generates random numbers. Also, for the execution unit, a control register (CTLA) 805, an immediate register (IMM.REG.) 806 and a register (BUSZ) 807 for storing the value of a bus (BUSZ), through which the execution results are output, are connected by a scanning method to perform a deficient test for the execution unit.

Also, a program for a circuit test is applied to the instruction ROM remained after implementing the ADPCM algorithm to be used for the circuit test.

The input values used for tests preferably select an automatic test pattern generator tool after the circuit layout.

The following table 1 summarizes the architecture of the specific microprocessor for ADCPM according to the present invention. Here, the system size is the result of the logic automatic synthesis using the libraries of various LSI manufactures and the library of Samsung Electronics Co., Ltd., excluding the instruction ROM which is a macrocell.

Also, for the purpose of examining the performance of the system, the actual voice signal and tones of various kinds of frequency were input. The run time for ADPCM was obtained by processing the actual voice signal and the respective tone data through an emulator to have the maximum value, the minimum value and the average value. Data quantity was 203,980 in total for about 25 seconds.

TABLE 1

| | |
|---|---|
| Operating frequency | 16.2 MHz |
| Performance | 16.2 MIPS |
| Word length | 16 bits |
| Input signal delay | 125 μs (8 KHz) |
| Output signal delay | Encoder 3.5 μs |
| | Decoder 36.4 μs |
| Run time for ADPCM | Maximum 119.0 μs |
| | Minimum 100.0 μs |
| | Average 112.0 μs |
| System size (Excluding INST.ROM) | 5,730 gates (LSI 10K) |
| | 5,600 gates (KG 60K) |

TABLE 1-continued

| | |
|---|---|
| ADPCM μ-program size | 895 words |
| Data memory size | RAM 62 words |
| | ROM 25 words |

In the present invention, the microprocessor is designed to be specific for ADPCM. However, a microprogram may be changed to adopt the microprocessor to another signal processing algorithm. Also, while the current structure of the microprocessor is maintained, the execution data size or execution unit can be modified and redesigned to be suitable for use with other applications, thereby allowing easy application to other fields such as to microcontrollers or communication systems.

As described above, according to the digital signal processor of the present invention, the execution unit is separated into an arithmetic unit, a multiplier unit, a logic unit, a shift unit and a log unit, to implement CCITT G721 ADPCM algorithm with a relatively small size, which reduces the system cost. Also, since the present invention primarily takes into consideration low power consumption, it is applicable to a mobile communication system. Also, the digital signal processor according to the present invention is easily capable of implementing other ADPCM rates and algorithms as well as the ADPCM algorithm by modifying only the program of an instruction ROM.

What is claimed is:

1. A digital signal processor comprising:

three parallel data buses;

clock generating means for generating a plurality of clock signals and for supplying the clock signals to the input/output means, controlling means, execution means, data storage means, and register means of the digital signal processor;

input/output means connected to at least one data bus, for supplying parallel input/output and serial input/output for inputting and outputting data signals to the digital signal processor;

controlling means for controlling the entire functioning of said microprocessor to transmit a control signal and a data signal to a desired position via said data buses;

execution means having an arithmetic unit, a multiplier unit, a logic unit, a shift unit and a log unit, for performing arithmetic and logic functions under the control of said controlling means, wherein the three data buses each connect at least the arithmetic multiplier, shift, and log units and;

data storage means for storing instructions and data necessary for adaptive differential pulse code modulation algorithm and executions; and register means for temporarily storing instructions or data output from said data storage means.

2. A digital signal processor as claimed in claim 1, wherein the multiplier unit of said execution unit performs an 8-bit multiplication function.

3. A digital signal processor comprising:

three data buses:

clock generating means for generating a plurality of clock signals and for supplying the clock signals to the input/output means, controlling means, execution means, data storage means, and register means of the digital signal processor, input/output means, connected to at least one data bus, for supplying parallel input/output and serial input/output for inputting and outputting data signals to the digital signal processor;

controlling means for controlling the entire functioning of said microprocessor to transmit a control signal and a data signal to a desired position via said data buses;

execution means having an arithmetic unit, a multiplier unit, a logic unit, a shift unit and a log unit, for performing arithmetic and logic functions under the control of said controlling means;

data storage means for storing instructions and data necessary for adaptive differential pulse code modulation algorithm and executions; and register means for temporarily storing instructions or data output from said data storage means, wherein said digital signal processor has an RISC structure which combines a pipeline structure in which an instruction is processed during one clock cycle with a Harvard structure in which instructions and data are separated.

4. A digital signal processor comprising:

three data buses;

clock generating means for generating a plurality of clock signals and for supplying the clock signals to the input/output means, controlling means, execution means, data storage means, and register means of the digital signal processor;

input/output means, connected to at least one data bus, for supplying parallel input/output and serial input/output for inputting and outputting data signals to the digital signal processor;

controlling means for controlling the entire functioning of said microprocessor to transmit a control signal and a data signal to a desired position via said data buses;

execution means having an arithmetic unit, a multiplier unit, a logic unit, a shift unit and a log unit, for performing arithmetic and logic functions under the control of said controlling means;

data storage means for storing instructions and data necessary for adaptive differential pulse code modulation algorithm and executions; and register means for temporarily storing instructions or data output from said data storage means, wherein said execution unit performs execution functions by four signals with different phases, wherein clocks having two phases which are not overlapped with each other are used to generate said four clock signals.

5. A digital signal processor comprising:

three data buses;

clock generating means for generating a plurality of clock signals and for supplying the clock signals to the input/output means, controlling means, execution means, data storage means, and register means of the digital signal processor;

input/output means connected to at least one data bus, for supplying parallel input/output and serial input/output for inputting and outputting data signals to the digital signal processor;

controlling means for controlling the entire functioning of said microprocessor to transmit a control signal and a data signal to a desired position via said data buses;

execution means having an arithmetic unit a multiplier unit, a logic unit, a shift unit and a log unit, for performing arithmetic and logic functions under the control of said controlling means;

data storage means for storing instructions and data necessary for adaptive differential pulse code modulation algorithm and executions; and register means for temporarily storing instructions or data output from said data storage means, wherein said digital signal processor adopts a 'RESET' state, a 'RUN' state and a 'SLEEP' state.

6. A digital signal processor as claimed in claim 5, wherein said 'SLEEP' state is a state before a next input is fetched after completing encoding and decoding functions for input signals, and wherein a system clock is not generated so that all circuits except said input/output means do not operate.

7. A digital signal processor comprising:

three data buses;

clock generating means for generating a plurality of clock signals and for supplying the clock signals to the input/output means, controlling means, execution means, data storage means, and register means of the digital signal processor;

input/output means, connected to at least one data bus, for supplying parallel input/output and serial input/output for inputting and outputting data signals to the digital signal processor;

controlling means for controlling the entire functioning of said microprocessor to transmit a control signal and a data signal to a desired position via said data buses;

execution means having an arithmetic unit a multiplier unit, a logic unit, a shift unit and a log unit, for performing arithmetic and logic functions under the control of said controlling means;

data storage means for storing instructions and data necessary for adaptive differential pulse code modulation algorithm and executions, and register means for temporarily storing instructions or data output from said data storage means, wherein in said input/output means, said serial input/output are used in inputting and outputting pulse code modulation data corresponding to a voice signal, and said parallel input/output are used in inputting and outputting adaptive differential pulse code modulation data.

8. A digital signal processor as claimed in claim 7, wherein said parallel input/output include a flag signal permitting input or output and a control signal for performing the input or output.

9. A digital signal processor comprising:

three data buses;

clock generating means for generating a plurality of clock signals and for supplying the clock signals to the input/output means, controlling means, execution means, data storage means, and register means of the digital signal processor, input/output means, connected to at least one data bus, for supplying parallel input/output and serial input/output for inputting and outputting data signals to the digital signal processor, controlling means for controlling the entire functioning of said microprocessor to transmit a control signal and a data signal to a desired position via said data buses;

execution means having an arithmetic unit, a multiplier unit, a logic unit, a shift unit and a log unit for performing arithmetic and logic functions under the control of said controlling means;

data storage means for storing instructions and data necessary for adaptive differential pulse code modulation algorithm and executions; and register means for temporarily storing instructions or data output from said data storage means, wherein the pipeline structure adopted by said digital signal processor performs: reading instructions and calculating an address of a next instruction; interpreting the function of said read instruction; receiving and executing material and storing an execution result in a register.

* * * * *